United States Patent
Hong

(10) Patent No.: US 8,514,003 B2
(45) Date of Patent: Aug. 20, 2013

(54) CLOCK SIGNAL GENERATION CIRCUIT

(75) Inventor: Nam Pyo Hong, Ichon-shi (KR)

(73) Assignee: SK Hynix Inc., Gyeonggi-do (KR)

( * ) Notice: Subject to any disclaimer, the term of this patent is extended or adjusted under 35 U.S.C. 154(b) by 94 days.

(21) Appl. No.: 13/178,787

(22) Filed: Jul. 8, 2011

(65) Prior Publication Data
US 2012/0249201 A1 Oct. 4, 2012

(30) Foreign Application Priority Data
Mar. 31, 2011 (KR) .................. 10-2011-0029686

(51) Int. Cl.
*H03K 3/00* (2006.01)

(52) U.S. Cl.
USPC ..................... 327/291; 327/299; 327/113

(58) Field of Classification Search
USPC ............ 327/113, 116, 154, 161, 276, 277, 327/291, 299; 331/1 A, 10, 17, 40
See application file for complete search history.

(56) References Cited

U.S. PATENT DOCUMENTS

| 5,990,715 | A * | 11/1999 | Nishimura | 327/158 |
| 6,181,174 | B1 * | 1/2001 | Fujieda et al. | 327/158 |
| 7,075,853 | B2 | 7/2006 | Jeong et al. | |
| 7,106,114 | B2 * | 9/2006 | Taniguchi | 327/158 |
| 7,821,311 | B2 * | 10/2010 | Kim et al. | 327/158 |

FOREIGN PATENT DOCUMENTS

| KR | 1020090108178 A | 10/2009 |
| KR | 1020100105148 A | 9/2010 |

* cited by examiner

*Primary Examiner* — An Luu

(74) *Attorney, Agent, or Firm* — William Park & Associates Patent Ltd.

(57) ABSTRACT

A clock signal generation circuit includes a clock delay control signal generation unit configured to divide a clock signal to generate a divided clock signal, generate a plurality of periodic signals which have different periods with each other during a half period of the divided clock signal, and output clock delay control signals from the plurality of periodic signals, and a doubler clock generation unit configured to delay the clock signal in response to the clock delay control signals to generate a delayed clock signal, and generate an output clock signal by mixing phases of the clock signal and the delayed clock signal.

29 Claims, 5 Drawing Sheets

FIG.1
(PRIOR ART)
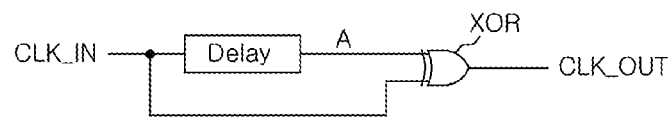
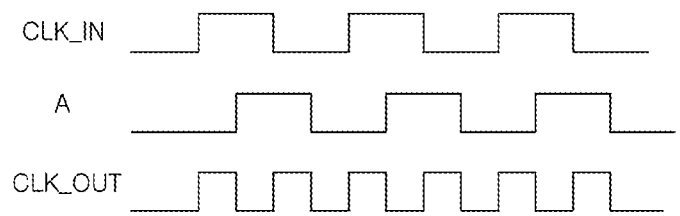
FIG.2
(PRIOR ART)
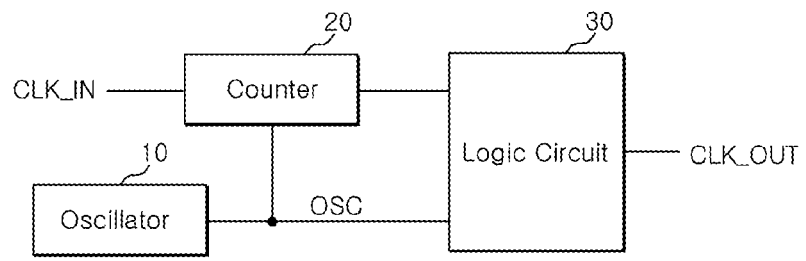
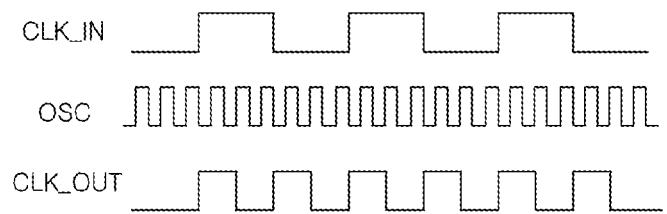

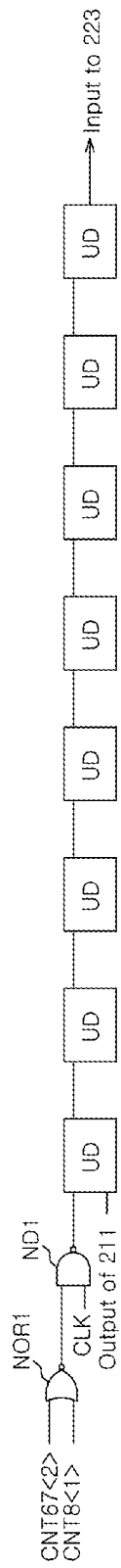
FIG.8
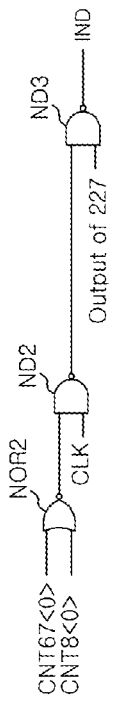
FIG.9
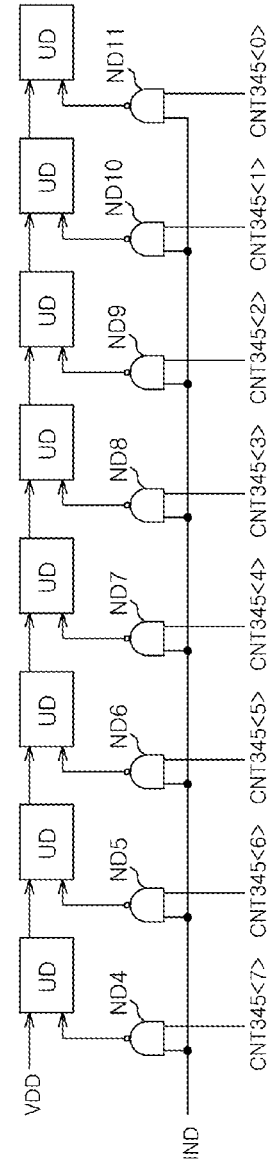

CLOCK SIGNAL GENERATION CIRCUIT

CROSS-REFERENCE TO RELATED APPLICATION

The present application claims priority under 35 U.S.C. §119(a) to Korean Patent Application No. 10-2011-0029686, filed on Mar. 31, 2011, in the Korean Intellectual Property Office, which is incorporated herein by reference in its entirety as if set forth in full.

BACKGROUND

1. Technical Field

Various embodiments of the present invention relate to clock signal generation circuits. In particular, certain embodiments relate to a clock signal generation circuit for generating a clock signal with a desired period from an input clock signal.

2. Related Art

A semiconductor integrated circuit typically operates in synchronization with a clock signal. The clock signal may be input from outside of the semiconductor integrated circuit, or may be generated through a clock generator in the semiconductor integrated circuit. Since the semiconductor integrated circuit performs various operations, it is not possible to perform all operations using only one clock signal with a constant period. Therefore, a circuit for generating a clock signal with a desired period from a clock signal with a reference period is required.

FIG. 1 is a diagram schematically illustrating a configuration of a clock multiplier generally used. In FIG. 1, the clock multiplier includes a delay Delay and an exclusive OR gate XOR. The delay Delay delays an input clock signal CLK_IN and the exclusive OR gate XOR performs an XOR operation on the input clock signal CLK_IN and the output A of the delay Delay to generate an output clock signal CLK_OUT. When the delay amount of the delay Delay is set to one-quarter (¼) of one period of the input clock signal CLK_IN, a phase difference of ninety degrees (90°) occurs between the input clock signal CLK_IN and the output A of the delay Delay. Consequently, it is possible to generate the output clock signal CLK_OUT with a frequency (a period of ½) that is twice as high as the frequency of the input clock signal CLK_IN through the operation of the exclusive OR gate XOR.

FIG. 2 is a diagram schematically illustrating the configuration of another clock multiplier in the conventional art. In FIG. 2, the clock multiplier includes an oscillator 10, a counter 20, and a logic circuit 30. The oscillator 10 continuously generates a periodic signal OSC with a frequency higher than a frequency of an input clock signal CLK_IN. The counter 20 receives the input clock signal CLK_IN and counts the number of toggles of the periodic signal OSC for one period of the input clock signal CLK_IN. The logic circuit 30 receives the output of the counter 20 and the periodic signal OSC. The logic circuit 30 continuously generates a clock signal with a pulse width corresponding to ½ of the counted value of the counter 20 from the periodic signal OSC, thereby generating an output clock signal CLK_OUT with a frequency that is twice as high as the frequency of the input clock signal CLK_IN.

However, the clock multipliers in the conventional art have the following problems. The clock multiplier illustrated in FIG. 1 has the simplest configuration. However, the duty ratio of the output clock signal may change significantly according to the amount and degree of delay. Furthermore, when the duty ratio of the input clock signal is not constant, jitter of the output clock signal may increase.

The clock multiplier illustrated in FIG. 2 has an advantage of being capable of reducing a change in the phase and the duty ratio. However, current consumption may increase according to the continuous use of the oscillator and an increase in the frequency of the periodic signal, and the areas of the counter and the logic circuit may significantly increase according to the bits of the counter.

SUMMARY

Accordingly, there is a need for an improved clock signal generation circuit capable of accurately and stably generating a clock signal with a desired period from an input clock signal.

In one embodiment of the present invention, a clock signal generation circuit includes: a clock delay control signal generation unit configured to divide a clock signal to generate a divided clock signal, generate a plurality of periodic signals for a half period of the divided clock signal, and output clock delay control signals generated from the plurality of periodic signals; and a doubler clock generation unit configured to delay the clock signal in response to the clock delay control signals to generate a delayed clock signal, and generate an output clock signal in response to the clock signal and the delayed clock signal.

In another embodiment of the present invention, a clock signal generation circuit includes: a clock delay control signal generation unit configured to divide a clock signal to generate a divided clock signal, generate a plurality of periodic signals for a half period of the divided clock signal, and output first and second clock delay control signals generated from the plurality of periodic signals; a doubler clock generation unit configured to delay the clock signal for a first time in response to the first clock delay control signals to generate a first delayed clock signal, and generate a first output clock signal in response to the clock signal and the first delayed clock signal; and a quadrupler clock generation unit configured to delay the first output clock signal for a second time in response to the second clock delay control signals to generate a second delayed clock signal, and generate a second output clock signal in response to the first output clock signal and the second delayed clock signal.

In still another embodiment of the present invention, a clock signal generation circuit includes: a periodic signal generation unit configured to divide a clock signal and generate a reference periodic signal for a half period of a divided clock signal; a clock decoding section configured to divide the reference periodic signal to generate a plurality of periodic signals, and decode the plurality of periodic signals to generate clock delay control signals; and a doubler clock generation unit configured to generate an output clock signal in response to the clock delay control signals and the clock signal.

In still another embodiment of the present invention, a clock signal generation circuit includes: a periodic signal generation unit configured to divide a clock signal and generate a reference periodic signal for a half period of a divided clock signal; a clock decoding section configured to divide the reference periodic signal to generate a plurality of periodic signals, and decode the plurality of periodic signals to generate first and second clock delay control signals; a doubler clock generation unit configured to generate a first output clock signal in response to the first delay control signals and the clock signal; and a quadrupler clock generation unit configured to generate a second output clock signal in response to the second clock delay control signals and the first output clock signal.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate various embodiments consistent with the invention and, together with the description, serve to explain the principles of the invention.

FIG. 1 is a diagram schematically illustrating the configuration of a clock multiplier in the conventional art.

FIG. 2 is a diagram schematically illustrating the configuration of another clock multiplier in the conventional art.

FIG. 8 is a diagram illustrating the configuration of the delay block illustrated in FIG. 7 according an embodiment.

FIG. 9 is a diagram illustrating the configuration of another delay block illustrated in FIG. 7 according an embodiment.

DETAILED DESCRIPTION

Figure 3:
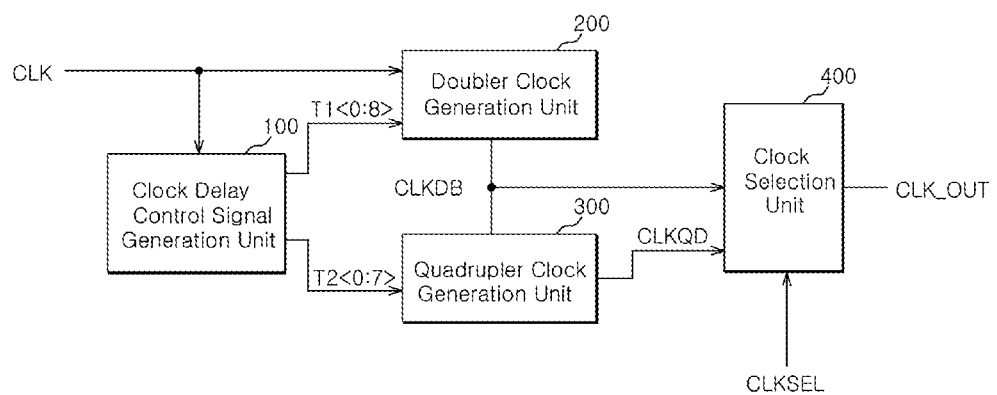
FIG. 3 is a block diagram schematically illustrating the configuration of a clock signal generation circuit according to an embodiment.

Reference will now be made in detail to the exemplary embodiments consistent with the present disclosure, examples of which are illustrated in the accompanying drawings. Wherever possible, the same reference characters will be used throughout the drawings to refer to the same or like parts.

FIG. 3 is a block diagram schematically illustrating the configuration of a clock signal generation circuit according to an embodiment. In FIG. 3, a clock signal generation circuit 1 includes a clock delay control signal generation unit 100, a doubler clock generation unit 200, and a quadrupler clock generation unit 300. The clock delay control signal generation unit 100 is configured to divide a clock signal CLK to generate a divided clock signal, and configured to generate a plurality of periodic signals for a half period of the divided clock signal. Furthermore, the clock delay control signal generation unit 100 is configured to generate first clock delay control signals T1<0:8> and second clock delay control signals T2<0:7> from the plurality of periodic signals. That is, the clock delay control signal generation unit 100 measures the period of the clock signal CLK and generates the first clock delay control signals T1<0:8> and the second clock delay control signals T2<0:7> according to the measurement result.

The doubler clock generation unit 200 is configured to delay the clock signal CLK for a first time in response to the first clock delay control signals T1<0:8> to generate a first delayed clock signal, and configured to generate a first output clock signal CLKDB in response to the clock signal CLK and the first delayed clock signal. For example, the first time may be set to a half period of the high level of the clock signal CLK, that is, a ¼ period of the clock signal CLK.

The quadrupler clock generation unit 300 is configured to delay the clock signal CLK for a second time in response to the second clock delay control signals T2<0:7> to generate a second delayed clock signal, and configured to generate a second output clock signal CLKQD in response to the first output clock signal CLKDB and the second delayed clock signal. For example, the second time may be set to a half of the first time. That is, the second time may be set to a one-eighth (⅛) period of the clock signal CLK. Consequently, in the embodiment, the doubler clock generation unit 200 can generate the first output clock signal CLKDB with a half (½) period (a frequency twice as high as that) of the clock signal CLK, and the quadrupler clock generation unit 300 can generate the second output clock signal CLKQD with a ¼ period (a frequency four times as high as that) of the clock signal CLK. However, the invention is not limited thereto. For example, it is possible to generate clock signals with various periods according to the configuration described in more detail below.

The clock signal generation circuit 1 according to the embodiment is configured to divide the clock signal CLK to generate the divided clock signal, and configured to generate the first output clock signal CLKDB and the second output clock signal CLKQD using the plurality of periodic signals generated only for the half period of the divided clock signal. Consequently, it is possible to reduce current consumption while generating the output clock signals with desired periods.

In FIG. 3, the clock signal generation circuit 1 may further include a clock selection unit 400. The clock selection unit 400 can output one of the first output clock signal CLKDB and the second output clock signal CLKQD as a final output clock signal CLK_OUT in response to a clock selection signal CLKSEL. For example, the clock selection signal CLKSEL may use a test mode signal.

Figure 4:
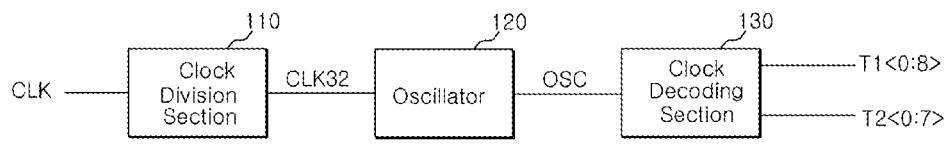
FIG. 4 is a block diagram schematically illustrating the configuration of the clock delay control signal generation unit illustrated in FIG. 3.

FIG. 4 is a block diagram schematically illustrating the configuration of the clock delay control signal generation unit illustrated in FIG. 3. The clock delay control signal generation unit 100 includes a clock division section 110, an oscillator 120, and a clock decoding section 130. The clock division section 110 is configured to divide the clock signal CLK to generate a divided clock signal CLK32. In FIG. 4, the clock division section 110 can divide the clock signal CLK by 32 to generate the divided clock signal CLK32 with a period that is 32 times as long as that of the clock signal CLK. The clock division section 110 may have a configuration in which five dividers for dividing input clock signals by 2 are connected in series to one another.

The oscillator 120 is configured to receive the divided clock signal CLK32 and generate a reference periodic signal OSC. The oscillator 120 receives the divided clock signal CLK32 to generate the reference periodic signal OSC with a predetermined period, and generates the reference periodic signal OSC which is continuously toggled for a half period of the divided clock signal CLK32. The clock division section 110 and the oscillator 120 serve as a divided signal generation unit.

The clock decoding section 130 is configured to receive the reference periodic signal OSC and generate a plurality of periodic signals from the reference periodic signal OSC. The clock decoding section 130 generates the first clock delay control signals T1<0:8> and the second clock delay control signals T2<0:7> from the plurality of periodic signals. The first clock delay control signals T1<0:8> and the second clock delay control signals T2<0:7> may be signals for designating the delay amount such that the clock signal received in the doubler clock generation unit 200 and the quadrupler clock generation unit 300 can be delayed for the first time and the second time. When each of the first clock delay control signals T1<0:8> and the second clock delay control signals T2<0:7> includes a plurality of bits, it is possible to generate the second clock delay control signals T2<0:7> by shifting the first clock delay control signals T1<0:8>. Detailed description thereof will be given below.

Figure 5:
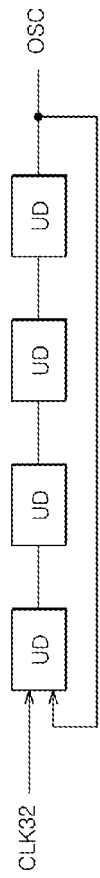
FIG. 5 is a diagram illustrating the configuration of the oscillator illustrated in FIG. 4 according an embodiment.

FIG. 5 is a diagram illustrating the configuration of the oscillator illustrated in FIG. 4 according the embodiment. In FIG. 5, the oscillator 120 includes four unit delays UD. When the received divided clock signal CLK32 is at a high level, the oscillator 120 can generate the reference periodic signal OSC continuously toggled through a loop formed through the four unit delays UD. For example, when the delay amount of the unit delay UD is set to 100 picoseconds, the period of the reference periodic signal OSC generated through the oscillator 120 is 800 picoseconds. Since the oscillator 120 is deactivated when the divided clock signal CLK32 goes from a high level to a low level, the oscillator 120 can generate the reference periodic signal OSC during the high level interval of the divided clock signal CLK32; i.e., during the half period of the divided clock signal CLK32.

Figure 6:
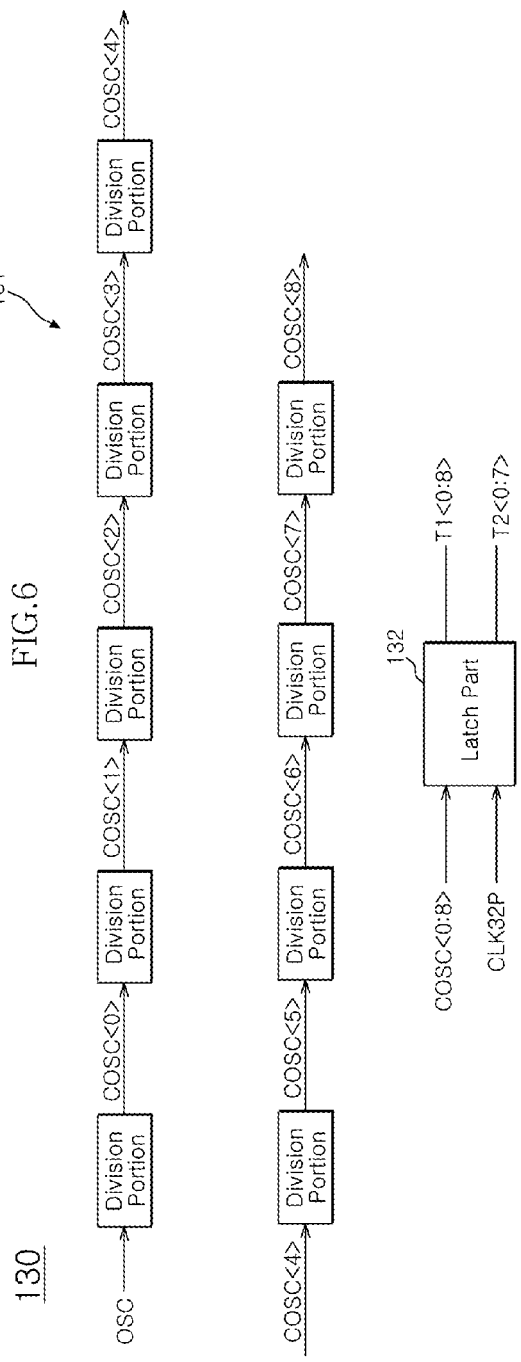
FIG. 6 is a diagram illustrating the configuration of the clock decoding section illustrated in FIG. 4 according an embodiment.

FIG. 6 is a diagram illustrating the configuration of the clock decoding section illustrated in FIG. 4 according the embodiment. The clock decoding section 130 includes a periodic signal division part 131 and a latch part 132. The periodic signal division part 131 is configured to receive the reference periodic signal OSC and generate a plurality of periodic signals COSC<0:8>. The periodic signal division part 131 can generate the plurality of periodic signals COSC<0:8> by sequentially dividing the reference periodic signal OSC by 2. The periodic signal division part 131 can sequentially divide the reference periodic signal OSC by 2 to generate the plurality of periodic signals COSC<0:8>. In FIG. 6, the periodic signal division part 131 has a configuration in which nine division portions are connected in series to one another. Since each division portion divides a reception signal by 2, it is possible to generate the plurality of periodic signals COSC<0:8> with a period that is twice as long as that of the reception signal. Since the reference periodic signal OSC is generated for the half period of the divided clock signal CLK32, the plurality of periodic signals COSC<0:8> are also generated for the half period of the divided clock signal CLK32.

The latch part 132 is configured to store the levels of the plurality of periodic signals COSC<0:8> at the time point at which the half period of the divided clock signal CLK32 ends; i.e., at the time point at which the divided clock signal CLK32 changes from the high level to the low level. The latch part 132 receives the plurality of periodic signals COSC<0:8> and a divided clock pulse CLK32P to generate the first clock delay control signals T1<0:8> and the second clock delay control signals T2<0:7>. The divided clock pulse CLK32P may be generated at the time point at which the divided clock signal CLK32 changes from the high level to the low level. The latch part 132 latches the levels of the plurality of periodic signals COSC<0:8> in response to the divided clock pulse CLK32P generated from the divided clock signal CLK32, and stores the latched levels as code values. The stored code values are output as the first clock delay control signals T1<0:8> and the second clock delay control signals T2<0:7>. The second clock delay control signals T2<0:7> are generated by shifting the first clock delay control signals T1<0:8>. For example, when it is assumed that the first clock delay control signals T1<0:8> have code values of 10011010, the second clock delay control signals T2<0:7> may have code values of 1001101 obtained by shifting the bits of the first clock delay control signals T1<0:8> rightward. As described above, the second time, which corresponds to the delay amount of the quadrupler clock generation unit 300, is ½ of the first time, which corresponds to the delay amount of the doubler clock generation unit 200. Furthermore, the code values of the second clock delay control signals T2<0:7> obtained by shifting the code values of the first clock delay control signals T1<0:8> rightward correspond to ½ of the code values of the first clock delay control signals T1<0:8>. Consequently, the first clock delay control signals T1<0:8> and the second clock delay control signals T2<0:7> can be used to decide the first time and the second time corresponding to ½ of the first time. However, the invention is not limited thereto. For example, the first time designated by the first clock delay control signals T1<0:8> and the shift scheme for generating the second clock delay control signals T2<0:7> may be changed and modified according to the period of a clock signal to be generated. Consequently, the clock delay control signal generation unit 100 illustrated in FIGS. 4 to 6 can generate the first clock delay control signals T1<0:8> and the second clock delay control signals T2<0:7>, which vary depending on the period of the input clock signal CLK.

Figure 7:
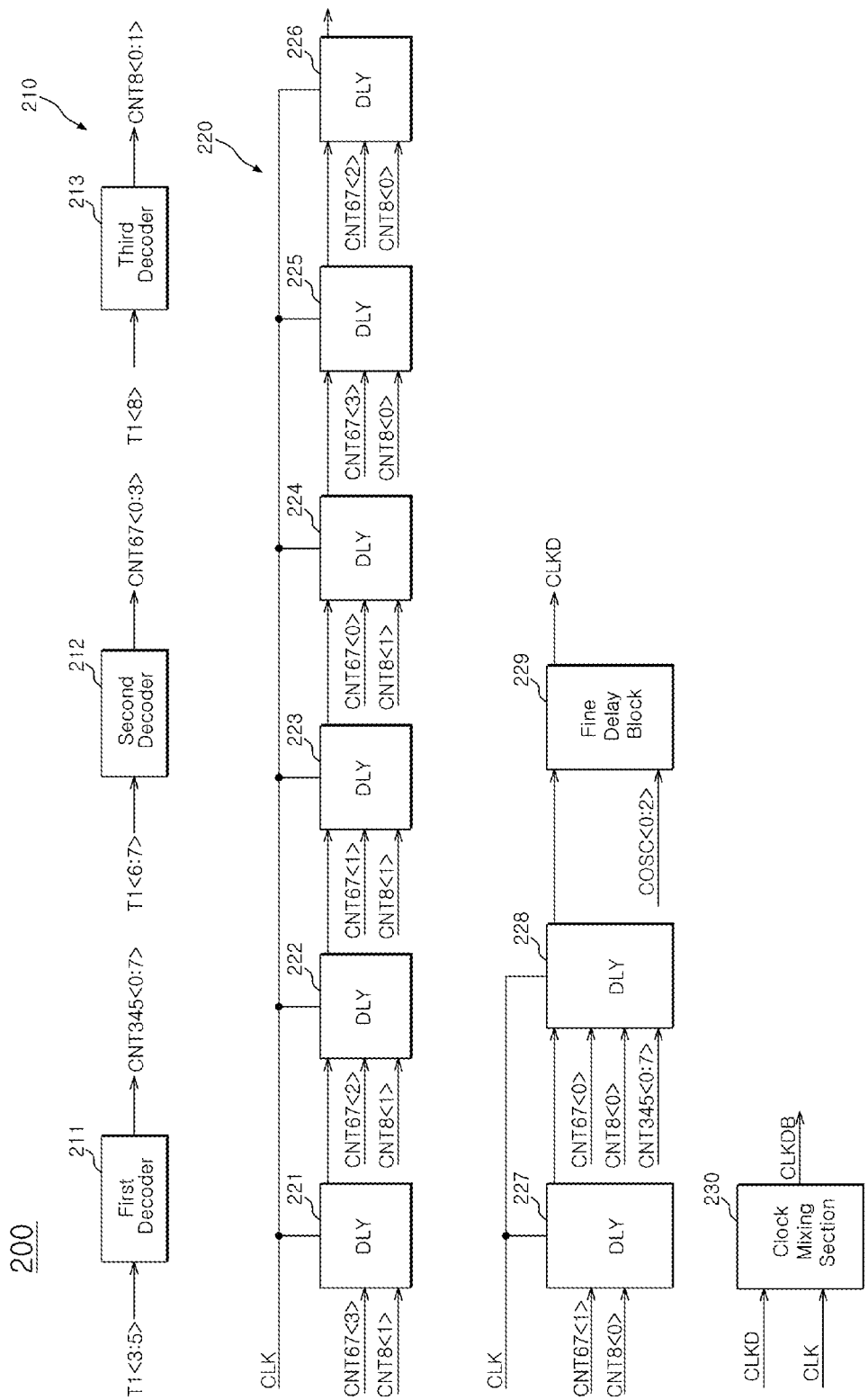
FIG. 7 is a diagram illustrating the configuration of the doubler clock generation unit illustrated in FIG. 3 according an embodiment.

FIG. 7 is a diagram schematically illustrating the configuration of the doubler clock generation unit illustrated in FIG. 3 according the embodiment. In FIG. 7, the doubler clock generation unit 200 includes a decoding section 210, a doubler clock delay section 220, and a clock mixing section 230. The decoding section 210 is configured to receive the first clock delay control signals T1<0:8>, decode the first clock delay control signals T1<0:8>, and generate first delay decoding signals CNT345<0:7>, CNT67<0:4> and CNT8<0:1>. The decoding section 210 includes the first to third decoders 211 to 213. The first decoder 211 is configured to decode the fourth to sixth bits T1<3:5> of the first clock delay control signal, the second decoder 212 is configured to decode the seventh and eighth bits T1<6:7> of the first clock delay control signal, and the third decoder 213 is configured to decode the ninth bit T1<8> of the first clock delay control signal. Meanwhile, the first to third bits T1<0:2> of the first clock delay control signal are used as the first delay decoding signals without separate decoding. Consequently, it is possible to generate the first delay decoding signals T1<0:2>, CNT345<0:7>, CNT67<0:3> and CNT8<0:1>. The reason for using the first to third bits T1<0:2> of the first clock delay control signal without decoding and decoding the fourth to ninth bits T1<3:8> thereof is as follows. The fourth bit T1<3> of the first clock delay control signal is generated from the divided signal COSC<3> output from the fourth division portion illustrated in FIG. 6. That is, the reference periodic signal OSC is divided four times to have a period that is sixteen times as long as that of the reference periodic signal OSC. Since the reference periodic signal OSC is generated from the four unit delays UD illustrated in FIG. 5, the 16-times periodic signal COSC<3> has a period corresponding to the 128 unit delay amount. In the embodiment, the first time corresponds to a ¼ period of the clock signal. In this regard, the 128 unit delay amount of the 16-times periodic signal is divided by 4. Furthermore, the reference periodic signal OSC is generated from the divided clock signal CLK32. Since the divided clock signal CLK32 is generated by dividing the clock signal CLK by 32 (that is, the divided clock signal CLK32 has a period that is 32 times as long as that of the clock signal CLK), the remaining 32 unit delay amount of the 16-times periodic signal is divided by 32 again. According to the calculation result above, the value of the fourth bit T1<3> of the first clock delay control signal is a time corresponding to 1 unit delay amount. Through the above calculation, the value of the seventh bit T1<6> of the first clock delay control signal is a time corresponding to 8 unit delay amount, and the value of the ninth bit of the first clock delay control signal is a time corresponding to 32 unit delay amount. Furthermore, the value of the first bit of the first clock delay control signal is to be a time corresponding to ⅛ unit delay amount. Therefore, when the bit values of the first delay decoding signals CNT345<0:7> increase one by one, the corresponding difference is 1 unit delay amount. When the bit values of the first delay decoding signals CNT67<0:3> increase, the corresponding difference is 8 unit delay amount. In the embodiment, the above specific decoding scheme has been described. However, the invention is not limited thereto. For example, the configuration of the oscillator and the decoding scheme may be changed and modified according to the requirement of a designer and a user or applications.

The doubler clock delay section 220 is configured to receive the first delay decoding signals CNT345<0:7>, CNT67<0:3> and CNT8<0:1>, delay the clock signal CLK for the first time, and generate a first delayed clock signal CLKD. In FIG. 7, the doubler clock delay section 220 includes first to eighth delay blocks (DLY) 221 to 228 and a fine delay block 229. The first to eighth delay blocks 221 to 228 are sequentially connected in series to one another, and include eight unit delays, respectively, which will be described in more detail with reference to FIG. 8. Whether the first to seventh delay blocks 221 to 227 are activated is determined in units of blocks in response to the first delay decoding signals CNT67<0:3> allocated thereto. Since the first delay decoding signals CNT67<0:3> have the difference corresponding to the 8 unit delay amount whenever there occurs an increase in the values thereof, whether the delay blocks each including the eight unit delays are activated is determined in units of blocks. Whether the eight unit delays included in the eighth delay block 228 are activated is determined in response to the first delay decoding signals CNT345<0:7> allocated thereto. Since the first delay decoding signals CNT345<0:7> have the difference corresponding to the 1 unit delay amount whenever there occurs an increase in the values thereof, whether the eight unit delays constituting the eighth delay block are activated is determined.

The fine delay block is configured to perform fine delay in response to the first delay decoding signals T1<0:2> without decoding. The doubler clock generation unit 200 can delay the clock signal CLK for the first time in response to the first delay decoding signals CNT345<0:7>, CNT67<0:3> and CNT8<0:1> and generate the first delayed clock signal CLKD.

The clock mixing section 230 is configured to mix the clock signal CLK with the first delayed clock signal CLKD and generate the first output clock signal CLKDB. The clock mixing section 230 may include a phase mixer, and for example, include an exclusive OR gate which receives the clock signal CLK and the first delayed clock signal CLKD as input signals.

FIG. 8 is a diagram illustrating the configuration of the second delay block illustrated in FIG. 7 according the embodiment. Since the first to seventh delay blocks 221 to 227 have configurations similar to one another, the second delay block 222 will be representatively described. The second delay block 222 is configured to receive the first delay decoding signals CNT67<2> and CNT8<1> and the clock signal CLK allocated thereto, and delay these signals. The second delay block 222 includes a first NOR gate NOR1, a first NAND gate ND1, and eight unit delays UD. The first NOR gate NOR1 is configured to receive the allocated first delay decoding signals CNT67<2> and CNT8<1>. The first NAND gate ND1 is configured to receive the output of the first NOR gate NOR1 and the clock signal CLK. The first unit delay UD is configured to receive the output of the first NAND gate ND1 and the output of the first delay block 221. Each of the second to eighth unit delays UD is configured to receive and delay the output of a unit delay of a previous stage. The unit delay UD has a unit delay amount substantially equal to that of the unit delay UD constituting the oscillator 120 illustrated in FIG. 5. The eighth unit delay UD is configured to output the final output to the delay block 223 of the next stage. Consequently, the delay block 222 can receive and delay the clock signal CLK to generate the output only when the allocated first delay decoding signals CNT67<2> and CNT8<1> are input at a low level. In other cases, the delay block 222 can block the input of the clock signal CLK, delay the input, which is output from the delay block 221 of a previous stage, and generate the output.

FIG. 9 is a diagram illustrating the configuration of the eighth delay block illustrated in FIG. 7 according the embodiment. In FIG. 9, the eighth delay block 228 includes a second NOR gate NOR2, second to eleventh NAND gates ND2 to ND11, and eight unit delays UD. The second NOR gate NOR2 is configured to receive the allocated first delay decoding signals CNT67<0> and CNT8<0>. The second NAND gate ND2 is configured to receive the output of the second NOR gate NOR2 and the clock signal CLK. The third NAND gate ND3 is configured to receive the output of the second NAND gate ND2 and the output of the seventh delay block 227 illustrated in FIG. 7. The third NAND gate ND3 generates an input signal IND, which is input to the eight unit delays UD. When the allocated first delay decoding signals CNT67<0> and CNT8<0> are at a low level, the delay block 228 can generate the input signal IND from the clock signal CLK. In other cases, the delay block 228 can generate the input signal IND from the output of the seventh delay block 227 illustrated in FIG. 7. The fourth to eleventh NAND gates ND4 to ND11 are configured to designate unit delays to which the input signal IND is input. That is, the fourth to eleventh NAND gates ND4 to ND11 commonly receive the input signal IND, and receive the allocated first delay decoding signals CNT345<0:7>, respectively. Thus, only a NAND gate receiving a signal at a high level of the allocated first delay decoding signals CNT345<0:7> is activated to output the input signal IND. Consequently, unit delays designated by the fourth to eleventh NAND gates ND4 to ND11 can receive the input signal IND, and the input signal IND can be output after being sequentially delayed by unit delays of the next stages. That is, when the first delay decoding signals CNT345<0:5> are at a high level, the input signal IND can be input to the third unit delay, and the input signal IND can be output after being sequentially delayed six times.

Referring to FIGS. 7 to 9, it can be understood that the doubler clock delay section 220 can simultaneously control four delay blocks (32 unit delay amount) in response to the first delay decoding signals CNT8<0:1>, control one delay block (8 unit delay amount) in response to the first delay decoding signals CNT67<0:3>, and individually control one unit delay (1 unit delay amount) in response to the first delay decoding signals CNT345<0:7>. All unit delays UD constituting the doubler clock delay section 220 have a delay amount substantially equal to that of the unit delays UD constituting the oscillator 120 illustrated in FIG. 5, as described above. Consequently, it is possible to set the delay amount of the first time for which the clock signal CLK should be delayed from the first clock delay control signals T1<0:8> generated from the periodic signal OSC.

The quadrupler clock generation unit 300 illustrated in FIG. 3 may have a configuration substantially equal to that of the doubler clock generation unit 200. That is, the quadrupler clock generation unit 300 is substantially equal to the doubler clock generation unit 200, except that signals to be decoded are the second clock delay control signals T2<0:7> and the first output clock signal CLKDB generated from the doubler clock generation unit 200 is received instead of the clock signal CLK.

The clock signal generation circuit according to the embodiment can divide a clock signal to generate a divided clock signal, and measure a high level pulse width (that is, a half period) of the clock signal using a plurality of periodic signals generated for a half period of the divided clock signal. That is, the high level pulse width of the clock signal can be measured by measuring a high level interval of the divided clock signal, and the first output clock signal can be generated by assigning a delay amount corresponding to ½ of the pulse width of the clock signal to the clock signal. In addition, the second output clock signal can be generated by assigning a delay amount, which corresponds to ¼ of the pulse width of the clock signal, to the first output clock signal using the shifting of code values. Moreover, the configuration of the oscillator and the configuration of the delay section are changed and modified, thereby generating clock signals with various periods other than ½ or ¼.

While certain embodiments have been described above, it will be understood to those skilled in the art that the embodiments described are by way of example only. Accordingly, the clock signal generation circuit described herein should not be limited based on the described embodiments. Rather, the clock signal generation circuit described herein should only be limited in light of the claims that follow when taken in conjunction with the above description and accompanying drawings.

What is claimed is:

1. A clock signal generation circuit comprising:
a clock delay control signal generation unit configured to divide a clock signal to generate a divided clock signal, generate a plurality of periodic signals which have different periods with each other during a half period of the divided clock signal, and output clock delay control signals generated from the plurality of periodic signals; and
a doubler clock generation unit configured to delay the clock signal in response to the clock delay control signals to generate a delayed clock signal, and generate an output clock signal by mixing phases of the clock signal and the delayed clock signal.

2. The clock signal generation circuit according to claim 1, wherein the clock delay control signal generation unit comprises:
a clock division section configured to divide the clock signal by a predetermined multiple and generate the divided clock signal;
an oscillator configured to receive the divided clock signal and generate a reference periodic signal during a half period of the divided clock signal; and
a clock decoding section configured to sequentially divide the reference periodic signal to generate the plurality of periodic signals, and generate the clock delay control signals from the plurality of periodic signals.

3. The clock signal generation circuit according to claim 2, wherein the clock decoding section comprises:
a periodic signal division part configured to sequentially divide the reference periodic signal by a predetermined multiple and generate the plurality of periodic signals; and
a latch part configured to latch levels of the plurality of periodic signals in response to the divided clock signal and generate the clock delay control signals.

4. The clock signal generation circuit according to claim 3, wherein the latch part is configured to latch the levels of the plurality of periodic signals at a time point at which a level of the divided clock signal changes, and generate the clock delay control signals.

5. The clock signal generation circuit according to claim 1, wherein the doubler clock generation unit comprises:
a decoding section configured to decode the clock delay control signals and generate delay decoding signals;
a doubler clock delay section configured to delay the clock signal in response to the delay decoding signals and generate the delayed clock signal; and
a clock mixing section configured to mix the clock signal with the delayed clock signal and generate the output clock signal.

6. A clock signal generation circuit comprising:
a clock delay control signal generation unit configured to divide a clock signal to generate a divided clock signal, generate a plurality of periodic signals which have different periods with each other during a half period of the divided clock signal, and output first and second clock delay control signals generated from the plurality of periodic signals;
a doubler clock generation unit configured to delay the clock signal for a first time in response to the first clock delay control signals to generate a first delayed clock signal, and generate a first output clock signal by mixing phases of the clock signal and the first delayed clock signal; and
a quadrupler clock generation unit configured to delay the first output clock signal for a second time in response to the second clock delay control signals to generate a second delayed clock signal, and generate a second output clock signal by mixing phases of the first output clock signal and the second delayed clock signal.

7. The clock signal generation circuit according to claim 6, wherein the clock delay control signal generation unit comprises:
a clock division section configured to divide the clock signal by a predetermined multiple and generate the divided clock signal;
an oscillator configured to receive the divided clock signal and generate a reference periodic signal during a half period of the divided clock signal; and
a clock decoding section configured to sequentially divide the reference periodic signal to generate the plurality of periodic signals, and generate the first and second clock delay control signals from the plurality of periodic signals.

8. The clock signal generation circuit according to claim 7, wherein the clock decoding section comprises:
   a periodic signal division part configured to sequentially divide the reference periodic signal by a predetermined multiple and generate the plurality of periodic signals; and
   a latch part configured to latch levels of the plurality of periodic signals in response to the divided clock signal and generate the first and second clock delay control signals.

9. The clock signal generation circuit according to claim 8, wherein the latch part is configured to latch the levels of the plurality of periodic signals at a time point at which a level of the divided clock signal changes and generate the first clock delay control signals.

10. The clock signal generation circuit according to claim 8, wherein the latch part is configured to shift the first clock delay control signals and generate the second clock delay control signals with code values smaller than code values of the first clock delay control signals.

11. The clock signal generation circuit according to claim 6, wherein the doubler clock generation unit comprises:
   a first decoding section configured to decode the first clock delay control signals and generate first delay decoding signals;
   a doubler clock delay section configured to delay the clock signal for the first time in response to the first delay decoding signals and generate the first delayed clock signal; and
   a first clock mixing section configured to mix the clock signal with the first delayed clock signal and generate the first output clock signal.

12. The clock signal generation circuit according to claim 11, wherein the quadrupler clock generation unit comprises:
   a second decoding section configured to decode the second clock delay control signals and generate second delay decoding signals;
   is a quadrupler clock delay section configured to delay the first output clock signal for the second time in response to the second delay decoding signals and generate the second delayed clock signal; and
   a second clock mixing section configured to mix the first output clock signal with the second delayed clock signal and generate the second output clock signal.

13. The clock signal generation circuit according to claim 7, wherein the second time corresponds to half of the first time.

14. The clock signal generation circuit according to claim 7, further comprising:
   a clock selection unit configured to selectively output one of the first and second output clock signals.

15. A clock signal generation circuit comprising:
   a periodic signal generation unit configured to divide a clock signal and generate a reference periodic signal during a half period of the divided clock signal;
   a clock decoding section configured to divide the reference periodic signal to generate a plurality of periodic signals which have different periods with each other, and decode the plurality of periodic signals to generate clock delay control signals; and
   a doubler clock generation unit configured to generate an output clock signal by mixing phases of the clock delay control signals and the clock signal.

16. The clock signal generation circuit according to claim 15, wherein the periodic signal generation unit comprises:
   a clock division section configured to divide the clock signal by a predetermined multiple and generate the divided clock signal; and
   an oscillator configured to receive the divided clock signal and generate the reference periodic signal during a half period of the divided clock signal.

17. The clock signal generation circuit according to claim 15, wherein the clock decoding section comprises:
   a periodic signal division part configured to sequentially divide the reference periodic signal by a predetermined multiple and generate the plurality of periodic signals; and
   a latch part configured to latch levels of the plurality of periodic signals in response to the divided clock signal and generate the clock delay control signals.

18. The clock signal generation circuit according to claim 17, wherein the latch part is configured to latch the levels of the plurality of periodic signals at a time point at which a level of the divided clock signal changes, and generate the clock delay control signals.

19. The clock signal generation circuit according to claim 15, wherein the doubler clock generation unit is configured to delay the clock signal in response to the clock delay control signals to generate a delay clock signal, and generate the output clock signal in response to the clock signal and the delayed clock signal.

20. The clock signal generation circuit according to claim 15, wherein the doubler clock generation unit comprises:
   a decoding section configured to decode the clock delay control signals and generate delay decoding signals;
   a doubler clock delay section configured to delay the clock signal in response to the delay decoding signals and generate a delayed clock signal; and
   a clock mixing section configured to mix the clock signal with the delayed clock signal and generate the output clock signal.

21. A clock signal generation circuit comprising:
   a periodic signal generation unit configured to divide a clock signal and generate a reference periodic signal during a half period of a divided clock signal;
   a clock decoding section configured to divide the reference periodic signal to generate a plurality of periodic signals which have different periods with each other, and decode the plurality of periodic signals to generate first and second clock delay control signals;
   a doubler clock generation unit configured to generate a first output clock signal by mixing phases of the first delay control signals and the clock signal; and
   a quadrupler clock generation unit configured to generate a second output clock signal by mixing phases of the second clock delay control signals and the first output clock signal.

22. The clock signal generation circuit according to claim 21, wherein the periodic signal generation unit comprises:
   a clock division section configured to divide the clock signal by a predetermined multiple and generate the divided clock signal; and
   an oscillator configured to receive the divided clock signal and generate the reference periodic signal during a half period of the divided clock signal.

23. The clock signal generation circuit according to claim 21, wherein the clock decoding section comprises:

a periodic signal division part configured to sequentially divide the reference periodic signal by a predetermined multiple and generate the plurality of periodic signals; and a latch part configured to latch levels of the plurality of periodic signals in response to the divided clock signal and generate the first and second clock delay control signals.

24. The clock signal generation circuit according to claim 23, wherein the latch part is configured to latch the levels of the plurality is of periodic signals at a time point at which a level of the divided clock signal changes, and generate the first clock delay control signals.

25. The clock signal generation circuit according to claim 24, wherein the latch part is configured to shift the first clock delay control signals and generate the second clock delay control signals with code values smaller than code values of the first clock delay control signals.

26. The clock signal generation circuit according to claim 21, wherein the doubler clock generation unit comprises:

a first decoding section configured to decode the first clock delay control signals and generate first delay decoding signals;

a doubler clock delay section configured to delay the clock signal for a first time in response to the first delay decoding signals and generate a first delayed clock signal; and a first clock mixing section configured to mix the clock signal with the first delayed clock signal and generate the first output clock signal.

27. The clock signal generation circuit according to claim 26, wherein the quadrupler clock generation unit comprises:

a second decoding section configured to decode the second clock delay control signals and generate second delay decoding signals;

is a doubler clock delay section configured to delay the first output clock signal for a second time in response to the second delay decoding signals and generate a second delayed clock signal; and a second clock mixing section configured to mix the first output clock signal with the second delayed clock signal and generate the second output clock signal.

28. The clock signal generation circuit according to claim 27, wherein the second time corresponds to half of the first time.

29. The clock signal generation circuit according to claim 21, further comprising:

a clock selection unit configured to selectively output one of the first and second output clock signals.

* * * * *